United States Patent
Fukuda et al.

(10) Patent No.: US 7,338,869 B2
(45) Date of Patent: Mar. 4, 2008

(54) SEMICONDUCTOR DEVICE AND ITS MANUFACTURING METHOD

(75) Inventors: Kenji Fukuda, Ibaraki (JP); Junji Senzaki, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 376 days.

(21) Appl. No.: 10/517,772

(22) PCT Filed: Jun. 26, 2003

(86) PCT No.: PCT/JP03/08146

§ 371 (c)(1),
(2), (4) Date: Jul. 12, 2005

(87) PCT Pub. No.: WO2004/003989

PCT Pub. Date: Jan. 8, 2004

(65) Prior Publication Data

US 2005/0245034 A1  Nov. 3, 2005

(30) Foreign Application Priority Data

Jun. 28, 2002  (JP) ............................. 2002-189161

(51) Int. Cl.
*H01L 21/336* (2006.01)
*H01L 21/31* (2006.01)
*H01L 21/469* (2006.01)

(52) U.S. Cl. ...................... 438/285; 438/778; 438/773; 257/E21.063; 257/E21.066

(58) Field of Classification Search ................ 438/778, 438/770, 773, 787, 285, 197, 910, 931; 251/E21.063, 251/E21.066, E27.062
See application file for complete search history.

(56) References Cited

U.S. PATENT DOCUMENTS 6,759,684 B2    7/2004  Fukuda et al.

(Continued)

FOREIGN PATENT DOCUMENTS

JP          9-199497        7/1997

(Continued)

OTHER PUBLICATIONS

Ogino, Shinji et al. "Channel Doped SIC-MOSFETs", Materials Science Forum, vols. 338-342, pp. 1101-1104 2000.

(Continued)

*Primary Examiner*—Walter Lindsay, Jr.
(74) *Attorney, Agent, or Firm*—Oblon, Spivak, McClelland, Maier & Neustadt, P.C.

(57) ABSTRACT

A semiconductor device and a method of manufacturing the device using a (000-1)-faced silicon carbide substrate are provided. A SiC semiconductor device having a high voltage resistancehigh blocking voltage and high channel mobility is manufactured by optimizing the heat-treatment method used following the gate oxidation. The method of manufacturing a semiconductor device includes the steps of forming a gate insulation layer on a semiconductor region formed of silicon carbide having a (000-1) face orientation, forming a gate electrode on the gate insulation layer, forming an electrode on the semiconductor region, cleaning the semiconductor region surface. The gate insulation layer is formed in an atmosphere containing 1% or more $H_2O$ (water) vapor at a temperature of from 800° C. to 1150° C. to reduce the interface trap density of the interface between the gate insulation layer and the semiconductor region.

44 Claims, 12 Drawing Sheets

U.S. PATENT DOCUMENTS

| | | |
|---|---|---|
| 6,764,963 B2 | 7/2004 | Fukuda et al. |
| 6,812,102 B2 | 11/2004 | Fukuda et al. |
| 2003/0013226 A1* | 1/2003 | Fukuda et al. .............. 438/400 |
| 2005/0245034 A1 | 11/2005 | Fukuda et al. |

FOREIGN PATENT DOCUMENTS

| | | |
|---|---|---|
| JP | 09-199497 | 7/1997 |
| JP | 10-50701 | 2/1998 |
| JP | 10-112460 | 4/1998 |
| JP | 11-31691 | 2/1999 |
| JP | 11-031691 | 2/1999 |
| JP | 11-74263 | 3/1999 |
| JP | 11-297712 | 10/1999 |
| JP | 2000-252461 | 9/2000 |
| WO | 00/13236 | 3/2000 |

OTHER PUBLICATIONS

Fukuda, K. et al. "Effect of oxidation method and post-oxidation annealing on interface properties of metal-oxide-semiconductor structures formed on n-type 4H-SiC C(0001) face", Applied Physics Letters, vol. 77, No. 6, pp. 866-868 2000.

U.S. Appl. No. 11/718,036, filed Apr. 26, 2007, Yatsuo et al.

* cited by examiner (a)

(b)

F I G. 7
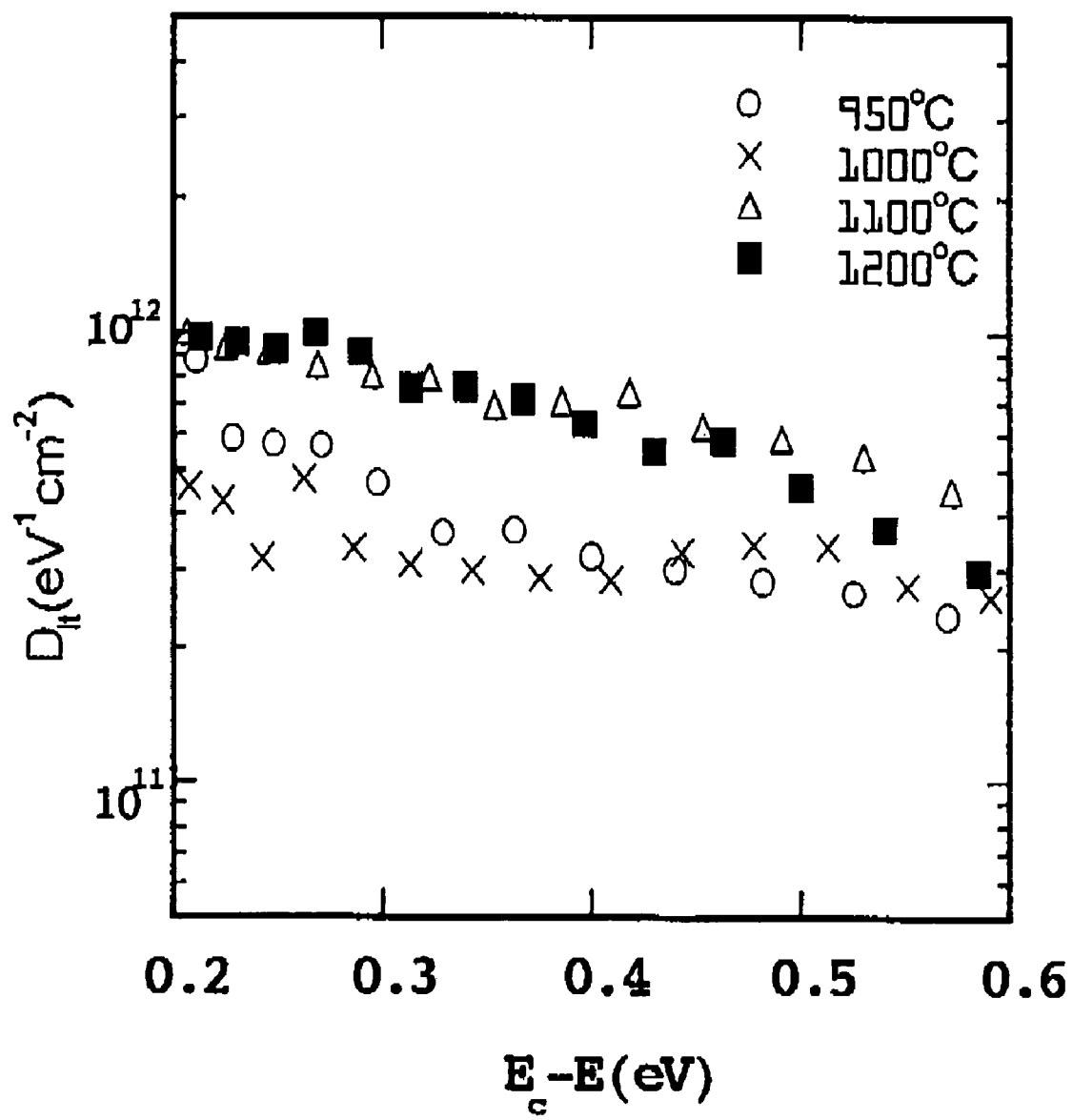

F I G. 8
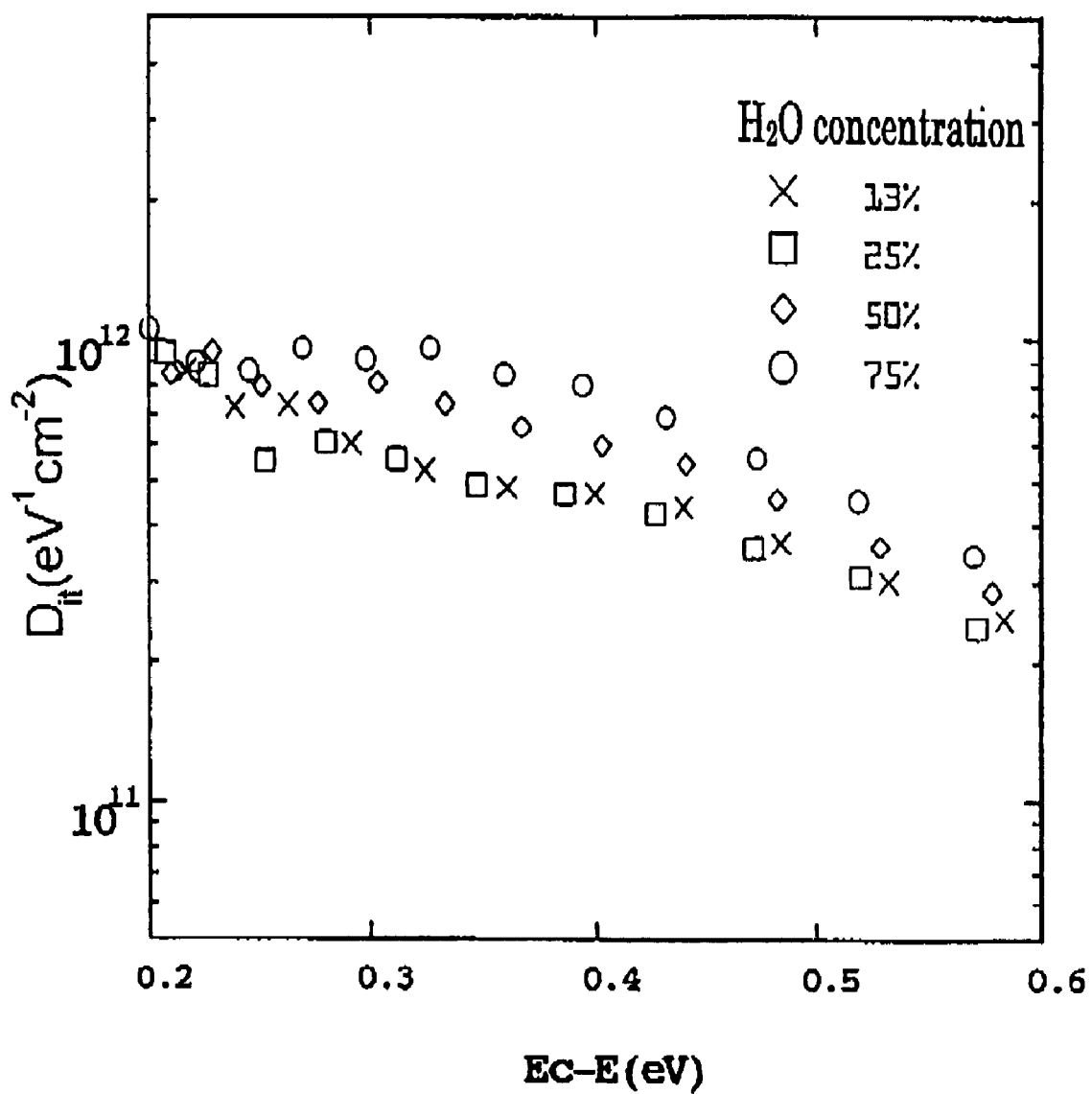

SEMICONDUCTOR DEVICE AND ITS MANUFACTURING METHOD

FIELD OF THE INVENTION

The present invention relates to a semiconductor device and to a method of manufacturing the semiconductor device on a silicon carbide substrate having a prescribed crystal plane orientation. It particularly relates to a semiconductor device that uses a gate insulation layer, such as those of a metal-oxide-semiconductor (MOS) capacitor or a MOS field-effect transistor (MOSFET), and to a method of manufacturing the semiconductor device.

BACKGROUND ART

The interface trap density of an oxide layer-silicon carbide interface using a silicon carbide (SiC) substrate is some ten times higher than that of a silicon MOS transistor. This gives rise to the problem that a silicon carbide substrate-based MOSFET has about one-tenth the channel mobility of a silicon substrate-based MOSFET. Although a bulk SiC substrate having the crystal structure referred to as 4H—SiC has about twice the channel mobility of a bulk SiC substrate having the crystal structure referred to as 6H—SiC, an oxide layer/silicon carbide interface has a high number of defects interface trap density) and, therefore, has lower channel mobility. It should be possible to utilize the higher channel mobility of a bulk 4H—SiC substrate to reduce the On-resistance of a power MOSFET. However, because of the low channel mobility, the On-resistance of 4H—SiC is higher than that of 6H—SiC, so reducing the interface trap density of the 4H—SiC MOS structure is critically important for realizing a SiC MOSFET. Typically, SiC has a (0001) face, a (11-20) face and a (000-1) face. The oxidation rate in the case of the (11-20) face is some ten times higher than that of the (0001) face, and that of the (000-1) face is higher still. This is because the oxidation mechanism of Si and C differs depending on the plane orientation. Since, therefore, the optimum oxidation conditions and post-oxidation annealing conditions for decreasing the interface trap density at the oxidation layer/silicon carbide interface also differ depending on the plane orientation, it is necessary to optimize oxidation conditions and post-oxidation annealing conditions for each plane orientation. In the initial research, SiC MOSFETs were formed on the (0001) face, but the channel mobility of such devices was no higher than 10 cm$^2$/Vs.

The recent literature describes channel mobility being improved to up to 110 cm$^2$/Vs by reducing the interface trap density by using H$_2$O (water) to form a gate insulation layer on the (11-20) face of SiC and then subjecting the layer to hydrogen annealing. However, the (11-20) face has lower dielectric breakdown field strength than the (0001) or (000-1) face, and is therefore disadvantageous for high-voltage-resistancehigh blocking voltage voltage power devices. Also, there are no reports of MOSFETs fabricated on the (000-1) face operating without the use of channel doping technology. The channel doping technology is not suitable for high-voltage-resistancehigh blocking voltageblocking voltage power devices, because although it improves channel mobility, leakage current flows more readily and voltage resistanceblocldng voltage decreases. The present invention provides a technology for forming on a (000-1) face having a higher dielectric breakdown voltage than a (11-20) face, an oxide layer/silicon carbide interface having higher channel mobility than a (0001) face.

With respect to the method of oxidizing the silicon carbide substrate and the subsequent heat-treatment method, there have already been a number of announcements and patent disclosures, described below.

JP-A HEI 9-199497, for example, discloses a method of improving a thermal oxidation layer of a SiC single-crystal substrate by following the oxidation step with an annealing step using hydrogen and an annealing step using inert gas to reduce hysteresis and flat band-shift. In particular, this publication describes a method in which the silicon carbide oxidation is followed by hydrogen annealing at 1000° C. This method relates to the (0001) face of a silicon carbide substrate, and does not describe anything relating to the (000-1) face. Moreover, a temperature of 1000° C. is too high, with the oxidation layer being reduced by the hydrogen, degrading the reliability of a device in which the oxidation layer is used as a gate layer.

JP-A HEI 10-112460 discloses a silicon carbide semiconductor device fabrication method in which, in order to reduce the interface trap density, a thermal oxidation layer is formed, subjected to less than two hours of annealing in an inert gas atmosphere, and then heat-treated at a low temperature in the range 300° C. to 500° C. in hydrogen or a gas containing hydrogen atoms such as in the form of water vapor. This is then followed by a cooling period, at least part of which takes place in a gaseous atmosphere containing hydrogen atoms. So, the disclosure describes a method in which the gate oxidation layer is formed and heat-treated at 300° C. to 500° C. in an atmosphere containing hydrogen atoms, but the method relates to the (0001) face of a silicon carbide substrate and teaches nothing relating to the (000-1) face. Also, the heat treatment temperature within the range 300° C. to 500° C. is too low for adequate heat-treatment.

JP-A HEI 11-31691 discloses a method of forming a thermal oxidation layer in a SiC semiconductor device in which the interface trap density following layer formation is reduced by, in a method of forming a thermal oxidation layer in which the layer is grown by a pyrogenic oxidation process by introducing hydrogen and oxygen, (1) using a hydrogen-oxygen mixture in which there is more hydrogen than oxygen, or (2) after oxidation, cooling in an atmosphere containing hydrogen atoms and using a cooling rate within the range 0.3 to 3° C./min, or (3) following oxidation and cooling, using an extraction temperature of not more than 900° C. While the disclosure does describe a method of cooling in an atmosphere containing hydrogen after the pyrogenic oxidation, the method relates to the (0001) face of a SiC substrate, and does not relate to the (000-1) face. Also, the described mixture ratio of hydrogen and oxygen used in the pyrogenic method is not optimal.

JP-A 2000-252461 describes a semiconductor device fabrication method in which one, two or more oxide and/or nitride gate insulation layers are formed on at least the topmost layer of a silicon carbide substrate and are then annealed at 600° C. to 1600° C. in an atmosphere that contains hydrogen. In this method, a good gate insulation layer/silicon carbide interface able to adequately stand up to actual use can be obtained by using hydrogen to terminate silicon or carbon tangling bonds that exist in the interface to thereby adequately reduce the interface trap density. While the disclosure describes the use of heat treatment in hydrogen after forming the oxide layer on the silicon carbide substrate, the method relates to the (0001) face of a SiC substrate and has no disclosure of a desirable hydrogen heat treatment method with respect to the (000-1) face.

U.S. Pat. No. 5,972,801 discloses a method for obtaining improved oxide layers and resulting improved performance from oxide-based devices. The method reduces defects in an oxide layer on a silicon carbide substrate by using a process in which the oxide layer is exposed to an oxidizing atmosphere at a temperature that is below the temperature at which silicon carbide would oxidize while high enough to enable the oxidizing source gas to diffuse in the oxide, and for a time that is not long enough to cause additional oxidation of the silicon carbide substrate but is sufficient to density the oxide layer and improve the characteristics of the interface between the oxide layer and the substrate. The method describes treating the formed gate oxide layer at 600° C. to 1000° C. in an atmosphere containing water vapor, but this water vapor is produced not by the reaction of $H_2$ gas and $O_2$ gas, but by heating pure water. Moreover, the method as described does not relate to formation of a gate oxide layer on the (000-1) face followed by heat-treatment of the layer.

With respect to the (000-1) face of 6H—SiC, in Materials Science Forum, Vols. 338-342 (2000), p. 1101, S. Ogino, T. Oikawa and K. Ueno reported on the operation of a MOSFET formed using channel doping in which the dopant was implanted below the gate oxide layer, but did not report on results in cases in which channel doping was not used. Also, the report only described forming a gate oxide layer by dry oxidation in which the layer is dried in oxygen at 1100° C.

In Applied Physics Letters Vol. 77 (2000), p. 866, K. Fukuda, W. J. Cho, K. Arai, S. Suzuki, J. Senzaki and T. Tanaka reported, with respect to the relationship between interface trap density and a method of forming a gate oxide layer on the (000-1) face of 4H—SiC by thermal oxidation at 1200° C. However, they did not report on a method of forming a gate isulation layer at a temperature below 1200° C. and on the post-oxidation treatment.

As described in the foregoing, typically SiC has three faces: a (0001) face, a (11-20) face and a (000-1) face. The oxidation rate of the (11-20) face is higher than that of the (0001) face, and that of the (000-1) face is higher still. Specifically, the oxidation rate of the (000-1) face is some ten times higher than that of the (0001) face. Therefore, the optimum oxidation conditions and post-oxidation annealing conditions for decreasing the interface trap density at the oxidation layer/silicon carbide interface also differ from face to face. For example, in the case of the (0001) face, the interface trap density is lower when dry oxygen is used compared with when $H_2O$ is used, but in the case of the (11-20) face, the interface trap density is lower when $H_2O$ is used. The post-oxidation annealing effect also differs from face to face. Thus, the oxidation conditions and post-oxidation annealing conditions for minimizing the interface trap density have to be optimized for each face. In the initial research, SiC MOSFETs were formed on the (0001) face, but the channel mobility of such devices was no higher than 10 cm$^2$/Vs. Recent reports describe channel mobility being improved to up to 110 cm$^2$/Vs by reducing the interface trap density by using water to form a gate insulation layer on the (11-20) face of the SiC. However, the (11-20) face has lower dielectric breakdown field strength than the (0001) or (000-1) face, and is therefore disadvantageous for high-voltage-resistancehigh blocking voltage power devices. Also, there are no reports of MOSFETs fabricated on the (000-1) face operating without the use of channel doping technology. Channel doping is not suitable for high-voltage-resistance-high blocking voltage power devices, because although it improves channel mobility, it causes leakage current to flow more readily, so voltage resistanceblocking voltage decreases.

In view of the above-described superiority of the properties of the (000-1) face compared with those of the (0001) and (11-20) faces, an object of the present invention is to provide a SiC semiconductor device with a (000-1) face silicon carbide substrate in which the device is given a high voltage resistancehigh blocking voltage and a high channel mobility by opting the method of heat-treatment used following gate oxide formation.

DISCLOSURE OF THE INVENTION

A method of manufacturing a semiconductor device according to a first aspect of the invention comprises the steps of forming a gate insulation layer on a semiconductor region formed of silicon carbide having a (000-1) face orientation, forming a gate electrode on the gate insulation layer, forming an electrode on the semiconductor region, and cleaning a surface of the semiconductor region, wherein the gate insulation layer is formed in an atmosphere containing 1% or more $H_2O$ (water) vapor at a temperature of from 800° C. to 1150° C. to reduce an interface trap density of an interface between the gate insulation layer and the semiconductor region. Oxidizing a region of (000-1) face silicon carbide on a semiconductor substrate in an atmosphere containing 1% or more $H_2O$ vapor enables channel mobility to be improved.

In a second aspect of the invention in relation to the first aspect, the interface trap density of the interface between the gate insulation layer and the semiconductor region can be further reduced by forming the gate insulation layer in an atmosphere containing water vapor at a temperature of from 800° C. to 1050° C. The interface trap density can be reduced, enabling the channel mobility to be improved by thus limiting the temperature at which the gate insulation layer is oxidized on the (000-1) face silicon carbide region to 800° C. to 1050° C.

A method of manufacturing a semiconductor device according to a third aspect of the invention comprises the steps of forming a gate insulation layer on a semiconductor region formed of silicon carbide having a (000-1) face orientation, forming a gate electrode on the gate insulation layer, forming an electrode on the semiconductor region, cleaning a surface of the semiconductor region, wherein the step of forming the gate insulation layer is followed by heat treatment in an atmosphere containing $H_2$ (hydrogen) gas or $H_2O$ (water) vapor to reduce an interface trap density of an interface between the gate insulation layer and the semiconductor region. Channel mobility can thus be improved by following the forming of the gate insulation layer on the (000-1) face silicon carbide region of the substrate by heat treatment in an atmosphere containing $H_2$ or $H_2O$ at a concentration of from 1% to 100%.

A method of manufacturing the semiconductor device according to a fourth aspect of the invention comprises the steps of forming a gate insulation layer on a semiconductor region formed of silicon carbide having a (000-1) face orientation, forming a gate electrode on the gate insulation layer, forming an electrode on the semiconductor region, cleaning the semiconductor region surface, wherein the step forming the gate insulation layer is followed by heat treatment in an atmosphere containing $H_2O$ (water) vapor, followed by heat treatment in an atmosphere containing $H_2$ (hydrogen) gas to reduce an interface trap density of an interface between the gate insulation layer and the semiconductor region. Channel mobility can thus be improved by following the forming of the gate insulation layer on the (000-1) face silicon carbide region of the substrate by heat treatment in an atmosphere containing $H_2$ or $H_2O$ at a concentration of from 1% to 100%.

In a fifth aspect of the invention in relation to the second or third aspect, the heat treatment following the forming of the gate insulation layer is carried out in a mixed gas atmosphere of $H_2$ (hydrogen) gas and inert gas in which the $H_2$ (hydrogen) gas has a predetermined concentration of from 1% to 100%. Channel mobility can thus be improved by following the forming of the gate insulation layer on the (000-1) face silicon carbide region of the substrate by heat treatment in an atmosphere containing $H_2$ or $H_2O$ at a concentration of from 1% to 100%.

In a sixth aspect of the invention in relation to the second or third aspect, the heat treatment following the forming of the gate insulation layer is carried out in a mixed gas atmosphere of $H_2O$ (water) vapor and inert gas in which the $H_2O$ (water) vapor has a predetermined concentration of from 1% to 100%. Channel mobility can thus be improved by following the forming of the gate insulation layer on the (000-1) face silicon carbide region of the substrate by heat treatment in an atmosphere containing $H_2$ or $H_2O$ at a concentration of from 1% to 100%.

A seventh aspect of the invention in relation to the third, fifth or sixth aspect further comprises a heat treatment step in which the semiconductor region is maintained for a predetermined time in an inert gas atmosphere at a predetermined temperature, between the step of forming a gate insulation layer and the step of heat treatment in an atmosphere containing $H_2$ (hydrogen) gas or $H_2O$ (water) vapor. Thus, following the forming of the gate insulation layer with heat treatment in an inert gas atmosphere before the heat treatment in an atmosphere containing $H_2$ or $H_2O$ enables the channel mobility to be improved.

An eighth aspect of the invention in relation to the fourth, fifth or sixth aspect further comprises a heat treatment step in which the semiconductor region is maintained for a predetermined time in an inert gas atmosphere at a predetermined temperature, in a first period between the step of forming the gate insulation layer and the step of heat treatment in the atmosphere containing $H_2O$ (water) vapor, or in a second period between the heat treatment step in the atmosphere containing $H_2O$ (water) vapor and the heat treatment step in an atmosphere containing $H_2$ hydrogen) gas. Thus following the forming of the gate insulation layer with a heat treatment in an inert gas atmosphere either after the heat treatment in an atmosphere containing $H_2O$ or before the heat treatment in an atmosphere containing $H_2$, or in both steps, enables the channel mobility to be improved.

In a ninth aspect of the invention in relation to the fourth, fifth, sixth or eighth aspect, the heat treatment in an atmosphere containing $H_2O$ vapor is carried out at a higher temperature than the heat treatment in an atmosphere containing $H_2$ gas. Thus, the temperature of the heat treatment in an atmosphere containing $H_2$ gas is higher than the heat treatment in an atmosphere containing 1% or more $H_2O$ vapor, enabling the channel mobility to be improved.

In a tenth aspect of the invention in relation to any one of the third to ninth aspects, the heat treatment step in an atmosphere containing $H_2O$ (water) vapor, following the step of forming a gate insulation layer, is maintained for a predetermined time at a predetermined temperature of from 650° C. to 950° C. This enables the increase in the thickness of the gate insulation layer, due to the heat treatment step being within the range of from 650° C. to 950° C., to be made small enough to be ignored.

In an eleventh aspect of the invention in relation to any one of the third to tenth aspects, the gate insulation layer is formed by thermal oxidation of the semiconductor region. This enables the channel mobility to be improved.

In a twelfth aspect of the invention in relation to the eleventh aspect, the thermal oxidation of the semiconductor region is carried out in an atmosphere containing $H_2O$ (water) vapor, improving the channel mobility.

In a thirteenth aspect of the invention in relation to the twelfth aspect, the atmosphere containing $H_2O$ vapor comprises $H_2O$ vapor and oxygen, or $H_2O$ vapor, oxygen gas and inert gas, in which the $H_2O$ gas has a predetermined concentration of from 1% to 100%, thereby enabling the channel mobility to be improved.

In a fourteenth aspect of the invention in relation to the thirteenth aspect, the heat treatment following the forming of the gate insulation layer is carried out in an atmosphere containing $H_2O$ that comprises $H_2O$ vapor and oxygen gas, or $H_2O$ vapor, oxygen gas and inert gas, in which the $H_2O$ vapor has a predetermined concentration of from 10% to 50%, making it possible to decrease the interface trap density.

In a fifteenth aspect of the invention in relation to any one of the first to fourteenth aspects, the $H_2O$ (water) vapor is produced by the reaction between $H_2$ (hydrogen) gas and $O_2$ (oxygen) gas in the atmosphere in which the semiconductor region is placed. Using $H_2$ and $O_2$ (oxygen) to produce the $H_2O$ that is used suppresses the introduction of impurities, making it possible to improve the channel mobility.

In a sixteenth aspect of the invention in relation to the fifteenth aspect, the ratio $[O_2]/[H_2]$ between the flow rate $[H_2]$ of the $H_2$ $H_2$ (hydrogen) gas and the flow rate $[O_2]$ of the $O_2$ (oxygen) gas is within a predetermined range of from 0.1 to 100, providing improved channel mobility.

In a seventeenth aspect of the invention in relation to any one of the third to sixteenth aspects, the semiconductor region oxidation temperature is within a predetermined range of from 800° C. to 1150° C., which makes it possible to improve the channel mobility.

In a eighteenth aspect of the invention in relation to any one of the eleventh to seventeenth aspects, when the heat treatment following the forming of the gate insulation layer by thermal oxidation of the semiconductor region is carried out in an atmosphere containing $H_2O$ vapor, the heat treatment is carried out at a temperature that is lower than a temperature at which the gate insulation layer is formed, thereby making it possible to improve the channel mobility without increasing the thickness of the gate oxide layer.

In a nineteenth aspect of the invention in relation to any one of the third to eighteenth aspects, the beat treatment in an atmosphere containing $H_2$ hydrogen) gas is carried out at a temperature within a predetermined range of from 600° C. to 900° C. This makes it possible to improve the channel mobility by avoiding the use of hydrogen-based etching and the like.

In a twelfth aspect of the invention in relation to any one of the third to nineteenth aspects, formation of the gate insulation layer and the following heat treatment in an atmosphere of $H_2$ (hydrogen) gas, $H_2O$ (water) vapor or inert gas are carried out as a continuous process inside an apparatus shut off from the outside air. Doing these in an atmosphere containing $H_2O$ makes it possible to improve the channel mobility.

In a twenty first aspect of the invention in relation to any one of the first to twelfth aspects, the step of cleaning the surface of the semiconductor region uses ultraviolet irradiation to clean the semiconductor region placed in an ozone atmosphere, enabling the channel mobility to be improved.

In a twenty second aspect of the invention in relation to any one of the first to twenty first aspects, the step of cleaning the surface of the semiconductor region can also include the use of heat treatment in a $H_2$ (hydrogen) gas atmosphere, enabling the channel mobility to be improved.

In a twenty third aspect of the invention in relation to the twenty second aspect, the step of cleaning the surface of the semiconductor region can also include the use of ultraviolet irradiation to clean the semiconductor region placed in an ozone atmosphere, followed by cleaning using heat treatment in a $H_2$ (hydrogen) gas atmosphere. Doing this enables the channel mobility to be improved.

A twenty fourth aspect of the invention in relation to any one of the first to twenty third aspects further comprises the steps of forming an interlayer insulation layer, a wiring layer and an insulation layer that protects the wiring layer. This makes it possible to realize a silicon carbide device, circuit and power device having a sufficiently low On-resistance.

In a twenty fifth aspect of the invention in relation to any one of the third to twenty fourth aspects, the heat treatment in an atmosphere containing $H_2$ (hydrogen) gas is carried out after forming a gate electrode layer above the gate insulation layer. Doing this ensures that the gate insulation layer is not contaminated, enabling the channel mobility to be improved.

A twenty sixth aspect of the invention in relation to any one of the third to twenty fifth aspects further comprises heat treatment in an atmosphere containing $H_2$ (hydrogen) gas followed by heat treatment in an inert gas atmosphere at up to 600° C., which enables the channel mobility to be improved.

A semiconductor device according to a twenty seventh aspect of the invention comprises a gate insulation layer on a semiconductor region of (000-1) face silicon carbide, a gate electrode on the gate insulation layer and an electrode on the semiconductor region, wherein a hydrogen or hydroxyl group (OH) level in the gate insulation layer is from $1E19/cm^3$ to $1E20/cm^3$. Analysis of the H using SIMS (secondary ion mass spectroscopy) showed a channel mobility of 100 $cm^2/Vs$ or more in a device in which the hydrogen content of the gate insulation layer was $1E19/cm^3$ or more. However, because exceeding $1E20/cm^3$ can lead to a decrease in voltage resistanceelectric field strength due to the reduction of the oxide layer by the hydrogen, the content is limited to $1E19/cm^3$ to $1E201 \ cm^3$.

In a twenty eighth aspect of the invention in relation to the twenty seventh aspect, the semiconductor device may be a metal-insulator-semiconductor field effect transistor (MISFET) or a MIS capacitor. Manufacturing a MISFET or MIS capacitor of SiC makes it possible to fabricate a semiconductor device that can operate under high voltages and high temperatures.

In a twenty ninth aspect of the invention in relation to the twenty eighth aspect, the MISFET may be an n-channel type. Manufacturing the MISFET of n-channel SiC makes it possible to fabricate an n-channel semiconductor device that can operate under high voltages and high temperatures.

In a thirtieth aspect of the invention in relation to the twenty eighth aspect, the MISFET may be a p-channel type. Manufacturing the MISFET of p-channel SiC makes it possible to fabricate a p-channel semiconductor device that can operate under high voltages and high temperatures.

In a thirty first aspect of the invention in relation to the twenty seventh aspect, the semiconductor device is a circuit having a complementary metal-insulator-semiconductor (CMIS) composed of the MISFET according to the twenty ninth aspect or MIS capacitor according to the thirtieth aspect. Manufacturing a CMIS of SiC makes it possible to fabricate a semiconductor device that can operate under high voltages and high temperatures.

In a thirty second aspect of the invention in relation to the twenty seventh aspect, the semiconductor device may be a lateral resurf metal-insulator-semiconductor (lateral resurf MISFET) or a lateral double MIS field effect transistor (lateral DMISFET). Manufacturing a lateral resurf MISFET or lateral DMISFET of SiC makes it possible to fabricate a semiconductor device that can operate under high voltages and high temperatures.

In a thirty third aspect of the invention in relation to the twenty seventh aspect, the semiconductor device may be a vertical DMISFET. Manufacturing a vertical DMISFET of SiC makes it possible to fabricate a semiconductor device that can operate under high voltages and high temperatures.

In a thirty fourth aspect of the invention in relation to the twenty seventh aspect, the semiconductor device may be an insulated gate bipolar transistor (IGBT). Manufacturing an IGBT of SiC makes it possible to fabricate a semiconductor device that can operate under high voltages and high temperatures.

In a thirty fifth aspect of the invention in relation to the thirty fourth aspect, the semiconductor device may be a p-channel IGBT. Manufacturing a p-channel IGBT makes it possible to fabricate a semiconductor device that can operate under higher voltages and higher temperatures than an n-channel device.

A semiconductor device according to a thirty sixth aspect of the invention comprises a gate insulation layer on a semiconductor region of (000-1) face silicon carbide, a gate electrode on the gate insulation layer and an electrode on the semiconductor region, wherein a hydrogen or hydroxyl group (OH) level at an interface between the gate insulation layer and the semiconductor region is within a range of from $1E20/cm^3$ to $1E22/cm^3$. Analysis of H using SIMS (secondary ion mass spectroscopy) showed a channel mobility of 100 $cm^2/Vs$ or more in a device in which the hydrogen content of the gate insulation layer was $1E21/cm^3$ or more. However, because exceeding $1E22/cm^3$ can lead to a decrease in voltage resistance electric field strength due to the reduction of the oxide layer by the hydrogen, the content is limited to $1E20/cm^3$ to $1E22/cm^3$.

In a thirty seventh aspect of the invention in relation to the thirty sixth aspect, the semiconductor device may be a MISFET or a MIS capacitor. Manufacturing a MISFET or MIS capacitor of SiC makes it possible to fabricate a semiconductor device that can operate under high voltages and high temperatures.

In a thirty eighth aspect of the invention in relation to the thirty seventh aspect, the MISFET may be an n-channel type. Manufacturing the MISFET of n-channel SiC makes it possible to fabricate an n-channel semiconductor device that can operate under high voltages and high temperatures.

In a thirty ninth aspect of the invention in relation to the thirty seventh aspect, the MISFET may be a p-channel type. Manufacturing the MISFET of p-channel SiC makes it possible to fabricate a p-channel semiconductor device that can operate under high voltages and high temperatures.

In a fortieth aspect of the invention in relation to the thirty sixth aspect, the semiconductor device may be a circuit having a CMIS composed of the MISFET or MIS capacitor according to the thirty eighth or thirty ninth aspect. Manufacturing a CMIS of SiC makes it possible to fabricate a semiconductor device that can operate under high voltages and high temperatures.

In a forty first aspect of the invention in relation to the thirty sixth aspect, the semiconductor device may be a lateral resurf MISFET or a lateral DMISFET. Manufacturing a lateral resurf MISFET or lateral DMISFET of SiC makes it possible to fabricate a semiconductor device that can operate under high voltages and high temperatures.

In a forty second aspect of the invention in relation to the thirty sixth aspect, the semiconductor device may be a vertical DMISFET. Manufacturing a vertical DMISFET of SiC makes it possible to fabricate a semiconductor device that can operate under high voltages and high temperatures.

In a forty third aspect of the invention in relation to the thirty sixth aspect, the semiconductor device may be an IGBT. Manufacturing an IGBT of SiC makes it possible to fabricate a semiconductor device that can operate under high voltages and high temperatures.

In a forty fourth aspect of the invention in relation to the forty third aspect, the semiconductor device may be a p-channel IGBT. Manufacturing a p-channel IGBT makes it possible to fabricate a semiconductor device that can operate under higher voltages and higher temperatures than an n-channel device.

BRIEF DESCRIPTION OF THE DRAWINGS

FIG. 7 shows the interface trap density values obtained at $H_2O$-heat-treatment temperatures of 650° C., 750° C., 850° C. and 950° C., following formation of the gate oxide layer in an $H_2O$ atmosphere and heat-treatment in argon.

FIG. 8 shows the effect of the oxidation temperature on the interface trap density after heat treatment at 800° C. in hydrogen gas, following formation of the gate oxide layer in an $H_2O$ atmosphere and heat treatment in an argon atmosphere.

BEST MODE FOR CARRYING OUT THE INVENTION

The present invention provides a semiconductor device and method of manufacturing same, in which the focus is on a technology for forming an oxide layer/silicon carbide interface in the (000-1) face, which has higher dielectric breakdown field strength than the (11-20) face and higher channel mobility than the (0001) face. The embodiments of the present invention will now be described in detail with reference to the drawings.

A specific example of the method of manufacturing a semiconductor device will be described with reference to FIG. 1.

Figure 1:
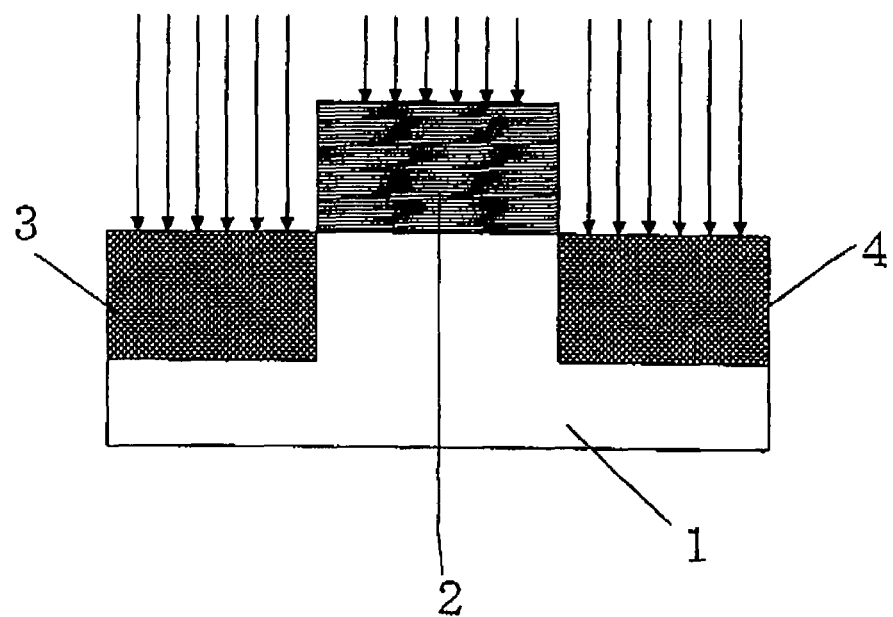
FIG. 1 is a schematic diagram illustrating a method of manufacturing a MOS field effect transistor.
Figure 1:
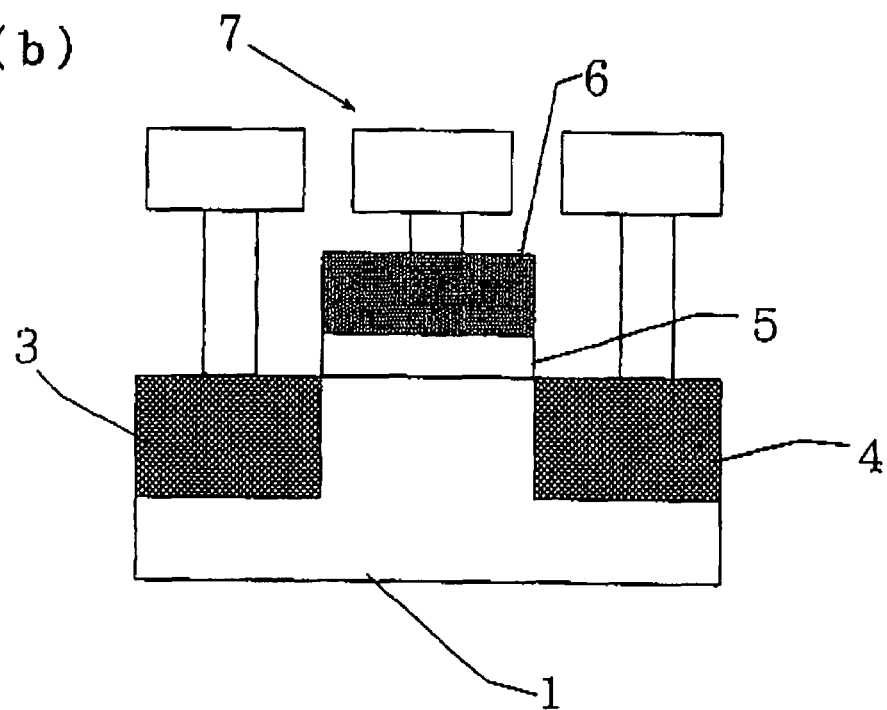

FIG. 1 is a cross-sectional view of the process of fabricating a MOS transistor using a silicon carbide substrate, shown partway through the fabrication procedure. FIG. 1(a) shows a (000-1)-faced p-type silicon carbide substrate 1 (4H—SiC, impurity concentration of $5 \times 10^{15}$ cm$^{-3}$) on which RIE (reactive ion etching) has been used to form photolithography alignment marks, following standard RCA cleaning. It is also possible to use, as the substrate, a silicon carbide layer grown on a silicon substrate.

With reference to FIG. 1(b), source and drain regions were formed by ion implantation, using an ion implantation mask 4 of $SiO_2$ formed by thermal oxidation or CVD (chemical vapor deposition).

In the case of this example, as shown in FIG. 1(ab), LTO (low temperature oxide) was used to form the ion implantation mask. The LTO layer was formed by reacting silane and oxygen at 400° C. to 800° C. to deposit silicon dioxide on the p-type silicon carbide substrate 1. After using photolithography to form the drain and source regions, HF (hydrogen fluoride) was used to etch the LTO down to the source and drain regions for the ion implantation. The source 3 and drain 4 shown in FIG. 1(b) were formed using nitrogen, phosphorus or arsenic ion implantation at 500° C. This was followed by activation heat treatment in an argon atmosphere at a temperature in the range of 1200° C. to 1700° C. In this example, the heat treatment consisted of five minutes at 1500° C. Next, the following were carried out to clean the substrate: 1) HF was used to etch away the sacrificial oxide layer; 2) the SiC substrate surface was subjected to ultraviolet radiation in an ozone atmosphere; followed by 3) 30 minutes of $H_2$ treatment at 1000° C.; and 4) carrying out 3) as a continuation of step 2). This was followed by oxidation in an atmosphere containing $O_2$ or $H_2O$ (water), at a temperature within the range of 800° C. to 1200° C., to thereby form the gate insulation layer 5 having a thickness of approximately 50 nm.

Oxidation using a gas containing $H_2O$ can be done by a method in which 1) vapor produced by heating $H_2O$ or 2) $H_2O$ produced by reacting $H_2$ (hydrogen) and $O_2$ (oxygen) is supplied to the substrate by a flow of oxygen or an inert gas (argon, nitrogen or helium). In this example, 1) or 2) was used to form a thermal oxidation layer. 2) was implemented at 800° C. to 1200° C. In this case too, $H_2O$ can also be supplied by a flow of inert gas. For comparison with the thermal oxidation layers, an LTO layer 50 nm thick was used to form the gate insulation layers, which was followed by heat treatment in an inert gas and cooling to room temperature. The step of heat-treating in an inert gas can be omitted, but is preferably included in order to manufacture a device having high reliability. The substrate was then heat-treated in an atmosphere containing $H_2$ or $H_2O$. In the case of $H_2$, the heat treatment was carried out at 400° C. to 900° C. In the case of $H_2O$, it is preferable to use a temperature of from 650° C. to 950° C. In this example, heat treatment was carried out at 650° C., 750° C., 850° C. and 950° C. All the water vapor used was produced by reacting $H_2$ and $O_2$ at 800° C., with the ratio $[O_2]/[H_2]$ between the flow rates of the hydrogen gas and oxygen gas being adjusted within the range 0.1 to 10. In the case of FIG. 1, the ratio was 3. The $H_2O$ vapor can also be supplied by a flow of inert gas (argon, nitrogen or helium). The substrate was then heat-treated in an inert gas, such as argon or nitrogen or the like. This step of heat-treating in an inert gas can be omitted, but is preferably included in order to manufacture a device having high reliability. This was followed by $H_2O$ heat treatment at a low temperature, which was followed by $H_2$ heat treatment. The second heat treatment using $H_2$ or $H_2O$ can be omitted, but is preferably included in order to manufacture a device having high reliability. In this example, the $H_2O$ treatment was carried out at 650° C. and 850° C., and the following hydrogen treatment at 800° C.

Next, gate electrode 6 was formed. The gate electrode 6 can be formed of aluminum or n- or p-type polysilicon. This can be followed by forming thereon another layer of a silicide, such as $WSi_2$, $MoSi_2$ or $TiSi_2$. The gate electrode is then formed by etching the aluminum, n-type silicon or p-type silicon. An oxide layer is then deposited thereon, and a contact hole is locally etched in the oxide layer. Then, wet-etching is performed after vapor deposition of aluminum. Vapor deposition or sputtering is then used to form a metal layer containing nickel, titanium or aluminum, or a multilayer of metal layers, and RIB or wet-etching can be used to form a metal contact line 10. This was followed by heat treatment in nitrogen to complete the MOSFET.

Figure 2:
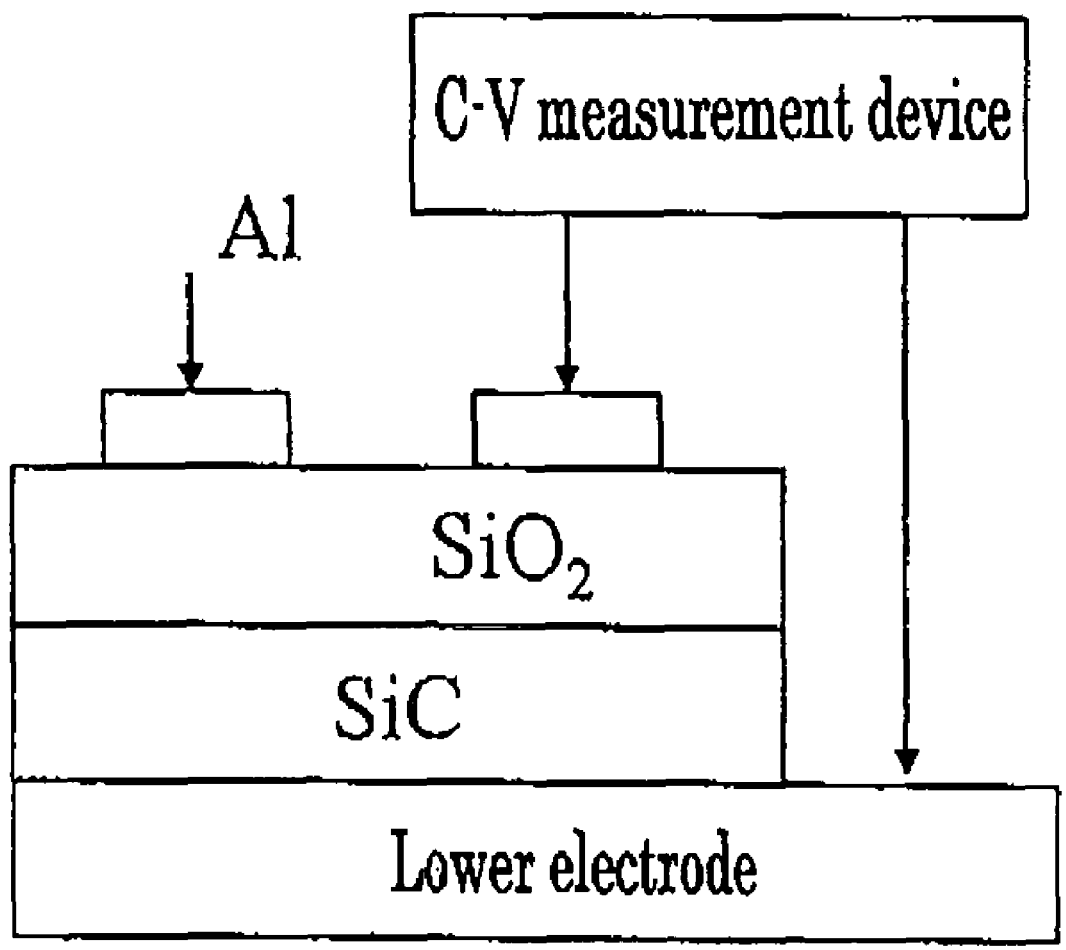
FIG. 2 is a schematic diagram showing the cross section of a MOS capacitor.

A MOS capacitor was also fabricated, as follows. First, a 10-nm-thick sacrificial oxide layer was formed on a (000-1) face n-type silicon carbide substrate (4H—SiC, impurity concentration of $5\times10^{15}$ cm$^{-3}$) that had been cleaned using standard RCA cleaning. The sacrificial oxide layer was removed using 5% hydrogen fluoride, and the gate insulation layer was formed and heat-treated. The gate insulation layer is formed and the following heat treatment carried out by the same methods used to manufacture a MOSFET. The vapor deposition method is then used to form an aluminum layer on the gate insulation layer and on the underside of the SiC substrate, and this is followed by the formation of a metal substrate on the underside, thereby completing the fabrication of the MOS capacitor having the cross-sectional structure shown in FIG. 2.

Annealing in an inert gas (argon) was used following oxidation in both cases, that is, when the gate oxide layer was formed in dry oxygen and when the gate oxide layer was formed in a $H_2O$ atmosphere. However, the MOSFETs in which the gate oxide layer was formed in dry oxygen did not work. MOSFETs in which the gate oxide layer was formed in a $H_2O$ atmosphere did work, and had channel mobility of 50 cm$^2$/Vs. Thus, MOSFETs could operate when the gate oxide layer was formed in a $H_2O$ atmosphere at not more than 1150° C., even on the (000-1) face.

Figure 3:
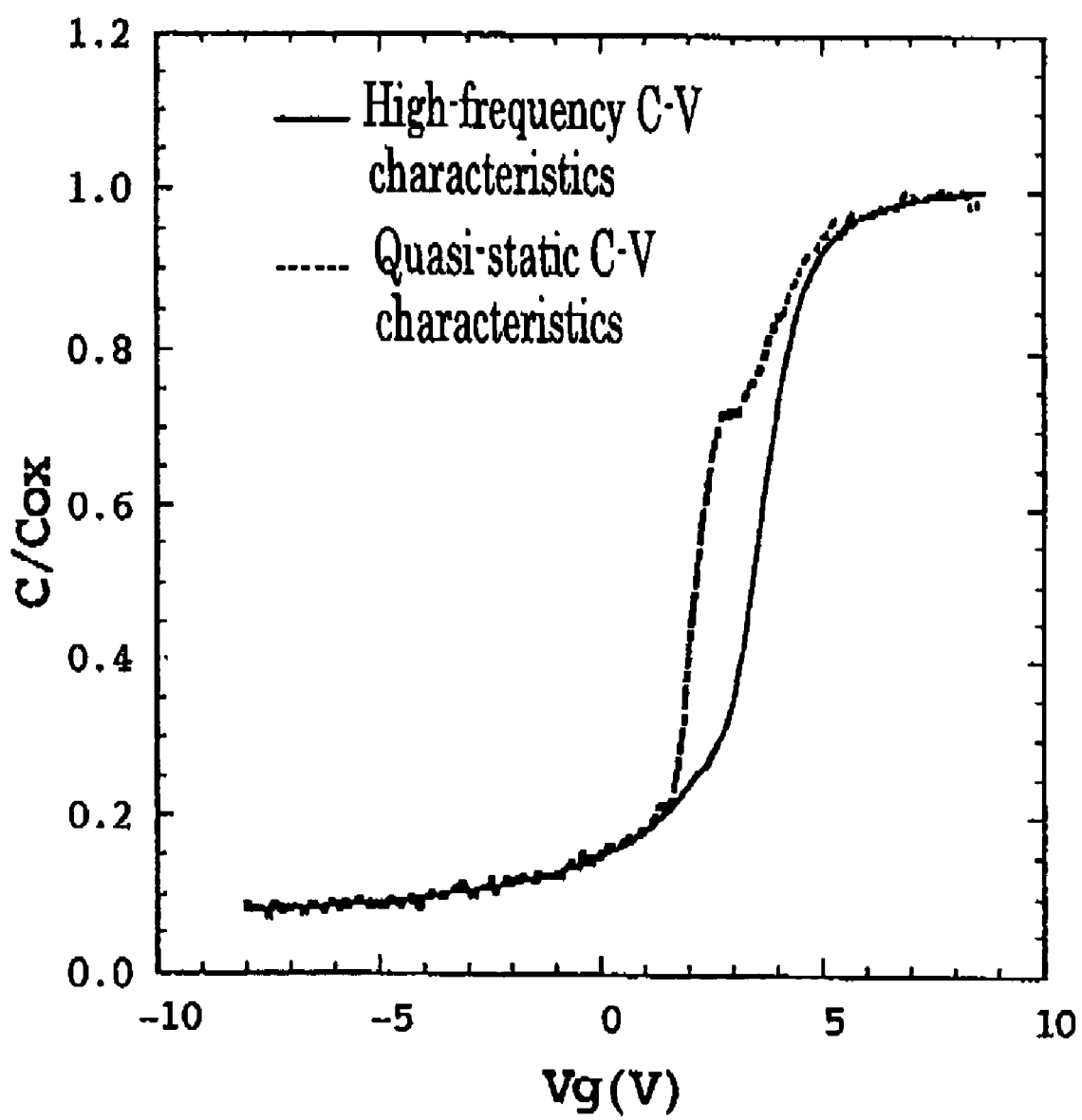
FIG. 3 shows the C-V characteristics of MOS capacitors having a gate insulation layer formed using heat treatment in an atmosphere of dry oxygen and Ar (argon), $H_2$ (hydrogen) and $H_2O$ (water). The solid lines show high-frequency C-V characteristics and the broken lines show quasi-static C-V characteristics.

FIG. 3 shows the high-frequency C-V characteristics (measurement frequency f=100 kHz) and quasi-static C-V characteristics (step voltage Vs=50 mV, delay time $t_d$=10 seconds) of sample MOS capacitors that, following formation of the gate insulation layer at 950° C. to 1200° C. in an atmosphere containing $H_2O$, were heat-treated for 30 minutes in an argon atmosphere. The solid lines show the high-frequency C-V characteristics and the broken lines show the quasi-static C-V characteristics. A larger difference between the two C-V characteristics indicates a higher interface trap density ($D_{it}$).

Figure 4:
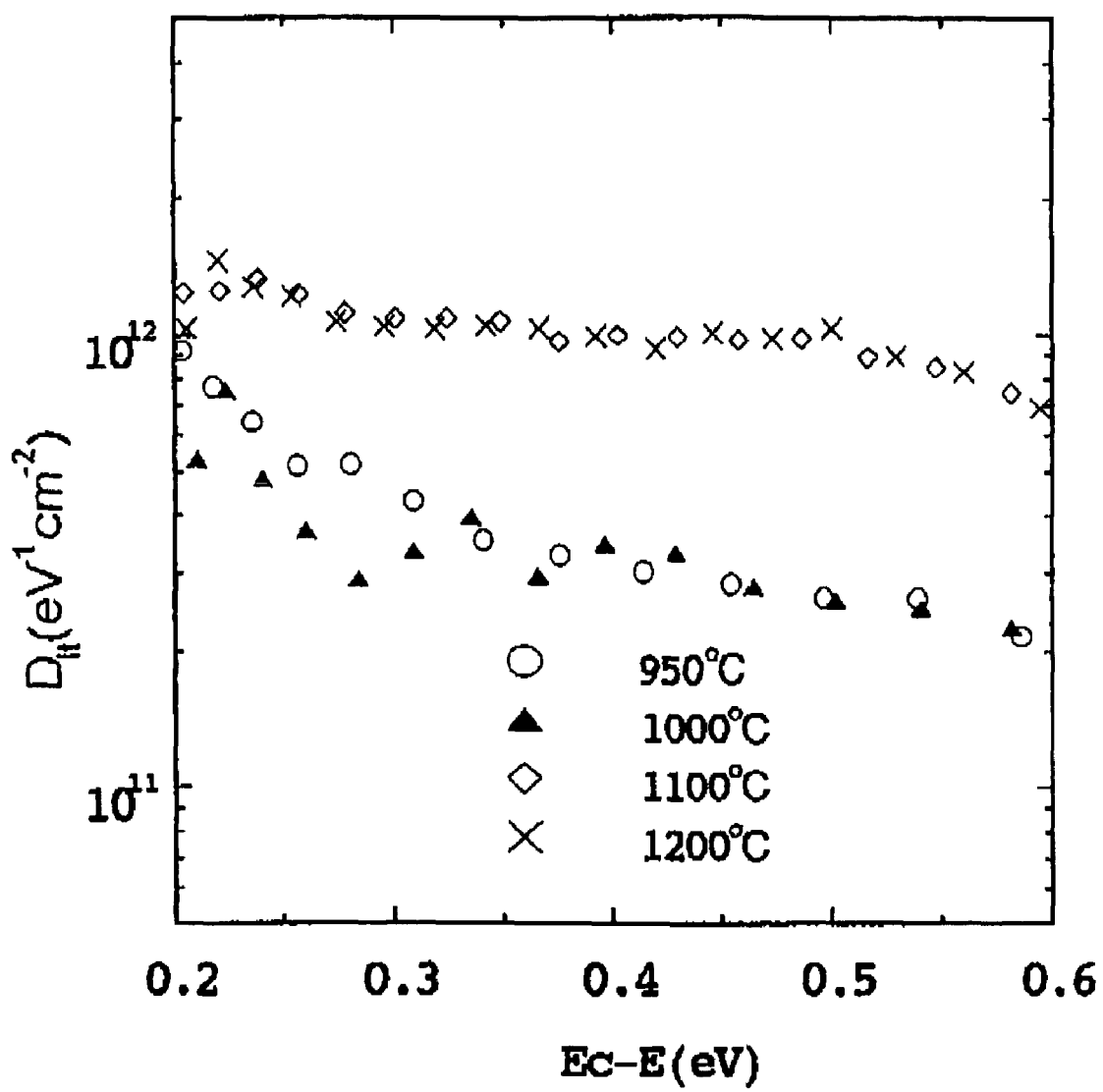
FIG. 4 shows distributions of interface trap density within the energy gap calculated from the C-V characteristics of FIG. 3.

FIG. 4 shows the distributions of the interface trap density ($D_{it}$) within the SiC energy band, calculated from the C-V characteristics of FIG. 3 by means of equation 1. Here, $C_h$ is the high-frequency capacitance, $C_q$ is the quasi-static capacitance, $C_{ox}$ is the oxide layer capacitance, and q is the electron charge.

$$D_{it} = \frac{1}{q}\left[\left(\frac{1}{C_q} - \frac{1}{C_{ox}}\right)^{-1} - \left(\frac{1}{C_h} - \frac{1}{C_{ox}}\right)^{-1}\right] \qquad \text{Equation 1}$$

FIG. 4 shows the interface trap densities of samples that, after formation of the gate insulation layer at 950° C. to 1200° C. in an atmosphere containing $H_2O$ vapor, were heat treated for 30 minutes in an argon atmosphere. Up to an oxidation temperature of 1100° C. or above, the $D_{it}$ is high and substantially constant, but decreases when the temperature drops below 1100° C. and becomes constant below 1000° C. Therefore, it is preferable to use an oxidation temperature that is lower than 1100° C.

Figure 5:
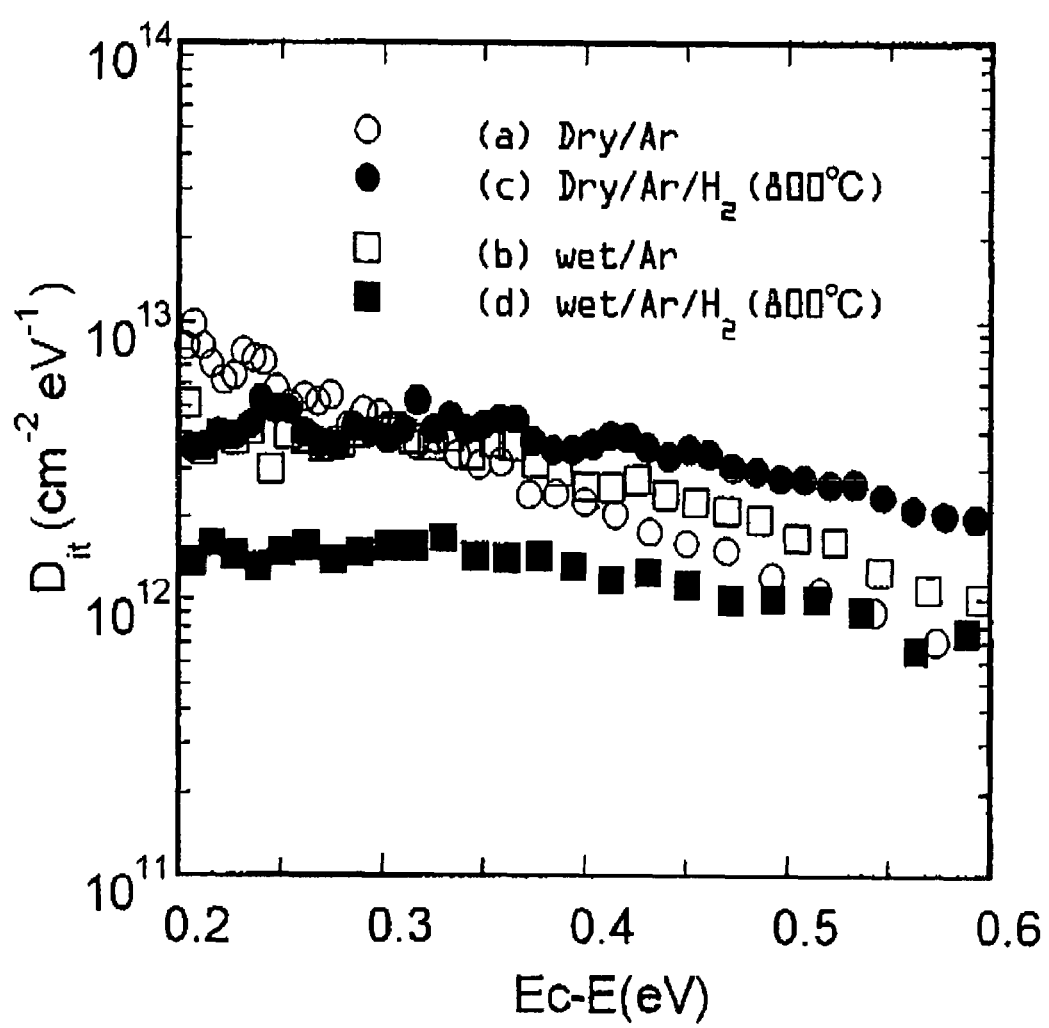
FIG. 5 shows distributions of interface trap density within the energy gap calculated from the C-V characteristics of MOS capacitors having a gate insulation layer formed by oxidation in a $H_2O$ atmosphere and heat treatment in an atmosphere of Ar, $H_2$ and $H_2O$.

FIG. 5 shows a comparison of SiC substrate samples thermally oxidized in dry oxygen (Dry) and in a $H_2O$ atmosphere (Wet) that were just heat-treated in argon and that were also heat-treated in argon and further heat-treated in hydrogen at 800° C. It can be seen that whatever the oxidation method used, hydrogen heat treatment reduces the $D_{it}$. Thus, hydrogen heat treatment has a $D_{it}$-reducing effect.

Figure 6:
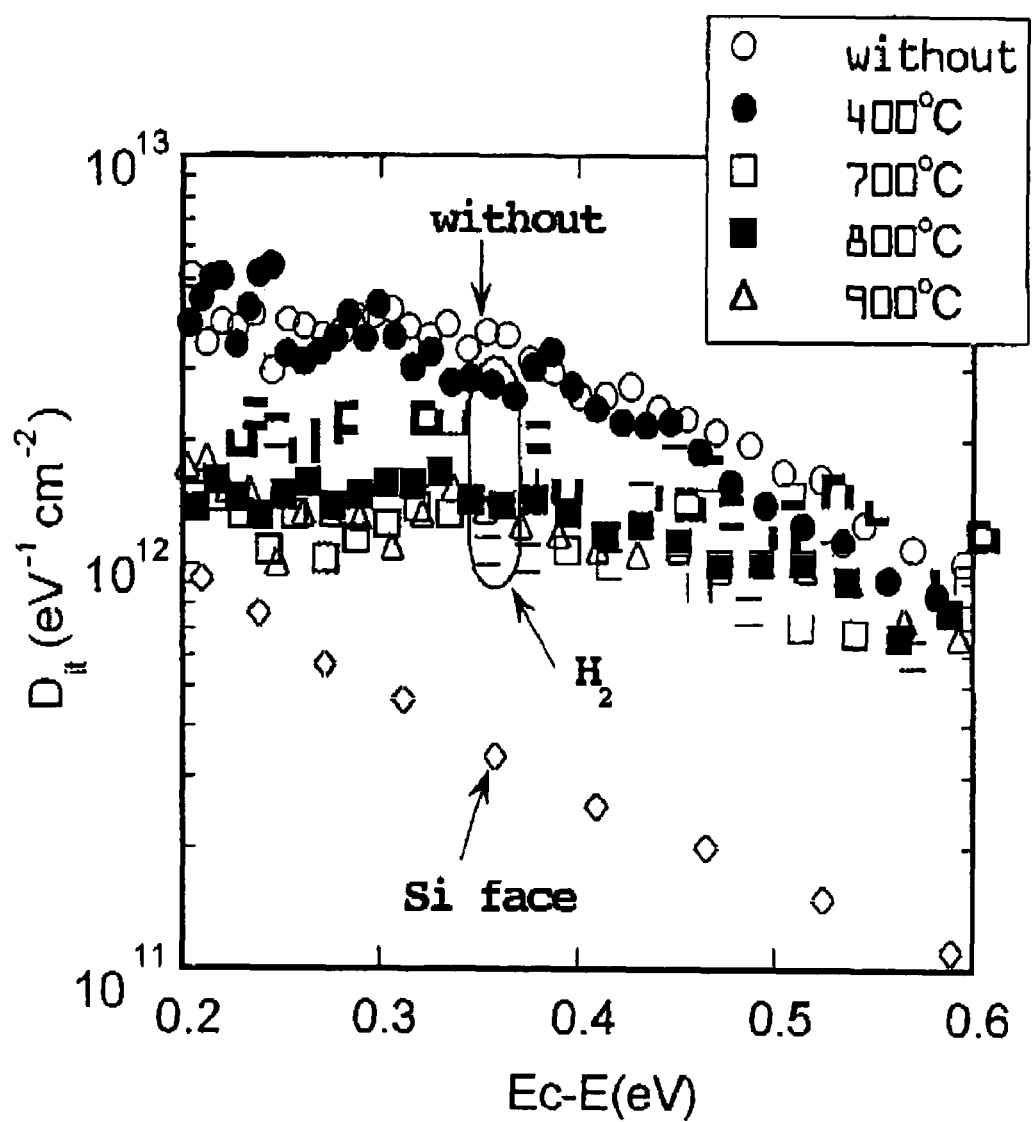
FIG. 6 shows the interface trap density values obtained at hydrogen-heat-treatment temperatures ranging from 400° C. to 900-C, following oxidation in an $H_2O$ atmosphere and heat-treatment in argon.

FIG. 6 shows interface trap densities obtained at hydrogen heat treatment temperatures ranging from 400° C. to 900° C., following oxidation in a $H_2O$ atmosphere and heat treatment in argon. Up to 400° C. there is no change, but above 400° C. there is a sharp reduction in density, and at 800° C. and above, there is saturation. At high temperatures over 1000C, the hydrogen reduces the gate insulation layer, degrading the reliability of the gate insulation layer, so it is desirable to limit the temperature of the hydrogen heat treatment to 400° C. to 1000° C.

FIG. 7 shows the effect of the oxidation temperature on the interface trap density when gate oxide layers formed in a $H_2O$ atmosphere at 950° C. to 1200° C. are heat-treated in an argon atmosphere, and are then also heat-treated at 800° C. in an atmosphere containing hydrogen gas. Up to an oxidation temperature of 1100° C. or above, the $D_{it}$ is high and substantially constant, but decreases when the temperature drops below 1100° C. and becomes constant below 1000° C. Therefore, when gate insulation layer formation is followed by hydrogen heat treatment, it is preferable to use an oxidation temperature that is lower than 1100° C.

FIG. 8 shows how the interface trap density is affected by the $H_2O$ concentration during gate insulation layer formation in a $H_2O$ atmosphere when, following the formation of the gate insulation layer in the $H_2O$ atmosphere, the gate insulation layer is heat-treated in an argon atmosphere, and is then also heat-treated at 800° C. in a hydrogen atmosphere. The interface trap density is constant up to a $H_2O$ vapor concentration of 25%, but increases at a concentration of 50% or more. Therefore, it is preferable to use a $H_2O$ vapor concentration that is lower than 50%.

With respect to these results, Table 1 shows the relationship between gate insulation layer formation conditions, post-oxidation heat treatment conditions and the MOSFET channel mobility.

TABLE 1

| Method of forming gate oxide layer | Gate oxide layer formation/heat treatment method | | |
|---|---|---|---|
| | Ar (1100° C.) | Ar + H$_2$ (1100° C.) | Ar (950° C.) |
| H$_2$O (water) atmosphere | 50 cm$^2$/Vs | 72 cm$^2$/Vs | 65 cm$^2$/Vs |

When the gate insulation layer was formed in a H$_2$O atmosphere, the channel mobility was 50 cm$^2$/Vs, but when the formed layer was heat-treated in H$_2$, the channel mobility became 72 cm$^2$/Vs. When an oxidation temperature of 950° C. was used, the channel mobility was 65 cm$^2$/Vs, so the channel mobility was improved by reducing the temperature.

Table 2 shows the results of a comparison between gate insulation layers formed using LTO and formed using thermal oxidation. In both cases, POA (post-oxidation annealing) was carried out in argon. The results show that a thermal oxidation layer has the effect of improving the channel mobility.

TABLE 2

| Gate oxidation layer | Channel mobility |
|---|---|
| LTO layer | <10 cm$^2$/Vs |
| Thermal oxidation layer | 50 cm$^2$/Vs |

Next, Table 3 shows the results of channel mobility obtained when pure water was heated to produce H$_2$O vapor that was cared by argon gas to oxidize the silicon carbide substrate, and when the substrate was oxidized using H$_2$O produced by the reaction of H$_2$ and O$_2$ and carried to the substrate by argon gas. The gate insulation layer was formed using a temperature of 1150° C. for 14 minutes. From the results, it can be seen that channel mobility is higher using H$_2$O produced by the reaction of H$_2$ and O$_2$, showing there is a channel mobility improvement effect.

TABLE 3

| H$_2$O production method | Channel mobility |
|---|---|
| Vaporization of pure water | <10 cm$^2$/Vs |
| Combustion of H$_2$ and O$_2$ | 50 cm$^2$/Vs |

Table 4 shows the effect that cleaning has on the channel mobility. The gate insulation layer was formed using a temperature of 1150° C. for 14 minutes.

TABLE 4

| SiC Substrate cleaning method | Channel mobility |
|---|---|
| None | 50 cm$^2$/Vs |
| Ultraviolet radiation in ozone | 55 cm$^2$/Vs |
| Hydrogen annealing | 57 cm$^2$/Vs |
| Ultraviolet radiation in ozone + hydrogen annealing | 60 cm$^2$/Vs |

These results show that the channel mobility is higher when the substrate is cleaned than when it is not cleaned. Channel mobility was 55 cm$^2$/Vs after cleaning using ultraviolet radiation in ozone, 57 cm$^2$/Vs after cleaning by hydrogen annealing and 60 cm$^2$/Vs after cleaning by ultraviolet radiation in ozone plus hydrogen annealing. This shows that the channel mobility is improved by cleaning by ultraviolet radiation in ozone, cleaning by hydrogen annealing and cleaning by ultraviolet radiation in ozone combined with hydrogen annealing.

Figure 9:
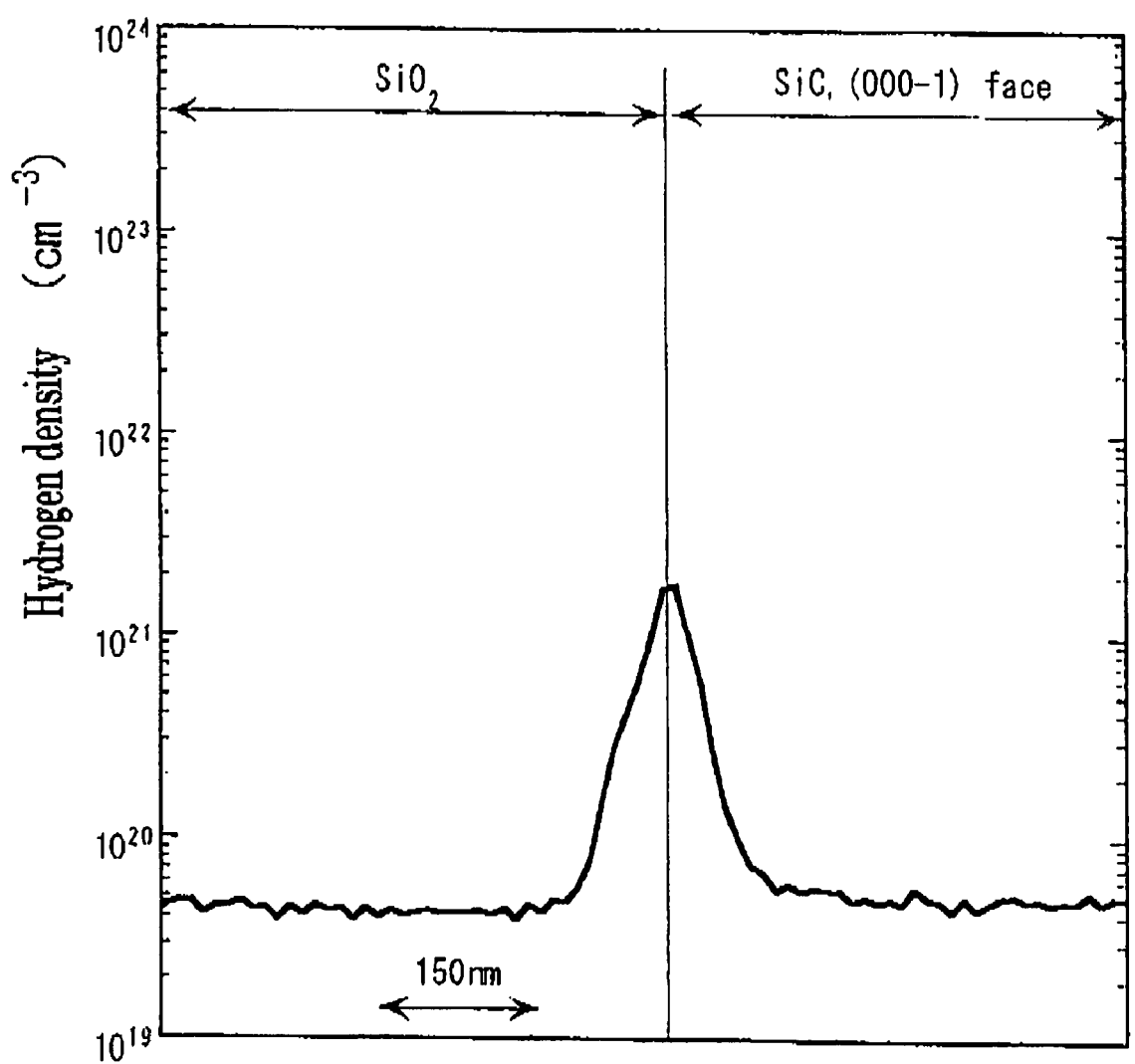
FIG. 9 shows the hydrogen density in a $SiO_2$ layer and $SiO_2$/SiC interface formed by oxidizing a (000-1) face SiC substrate in a $H_2O$ and $O_2$ (oxygen) atmosphere, measured using secondary ion mass spectroscopy (SIMS). The primary ion species used was Cs.

FIG. 9 shows the hydrogen density in a SiO$_2$ and SiO$_2$/SiC interface formed by oxidizing a (000-1) face SiC substrate in a H$_2$O and O$_2$ (oxygen) atmosphere, measured using secondary ion mass spectroscopy (SIMS). The primary ion used was Cs.

The channel mobility was 100 cm$^2$/Vs or more in a semiconductor device in which the hydrogen content of the gate oxide layer was 1E19/cm$^3$ or more. However, because exceeding 1E20/cm$^3$ can lead to a decrease in voltage resistanceelectric field strength of the oxide layer due to the reduction of the oxide layer by the hydrogen, the content is limited to 1E19/cm$^3$ to 1E20/cm$^3$. The channel mobility was 100 cm$^2$/Vs or more in a semiconductor device having an interface between a gate oxide layer and a semiconductor region in which the hydrogen content was 1E21/cm$^3$ or more. However, because exceeding 1E22/cm$^3$ can lead to a decrease in the voltage resistanceelectric field strength due to the reduction of the oxide layer by the hydrogen, the content is limited to 1E20/cm$^3$ to 1E22/cm$^3$.

Figure 10:
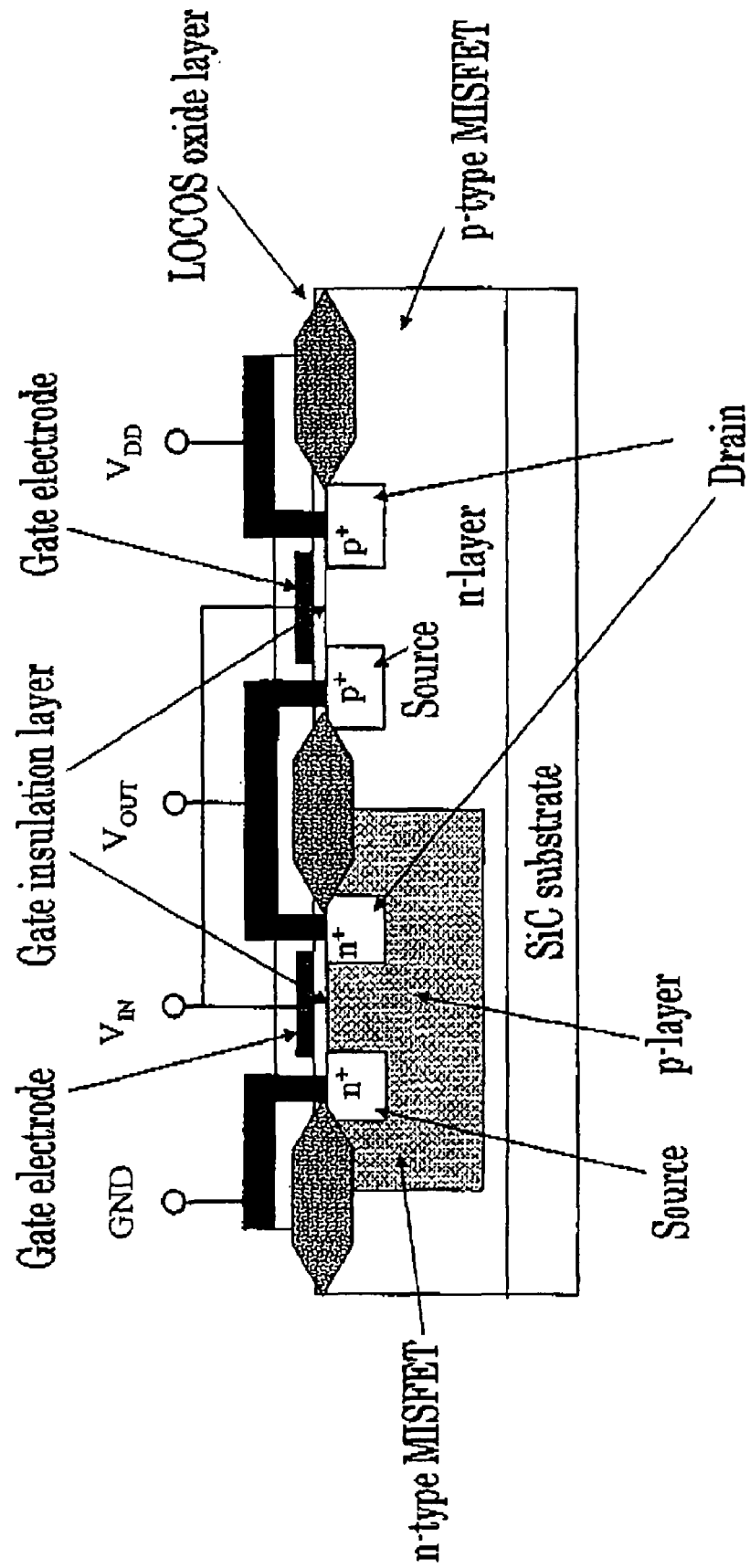
FIG. 10 is a cross-sectional view of a complementary metal-insulator-semiconductor (CMIS) circuit comprised of an n-channel metal-insulator-semiconductor field effect transistor (MISFET) and a p-channel MISFET.

FIG. 10 is a cross-sectional view of a complementary metal insulator semiconductor (CMIS) circuit comprised of an n-channel metal insulator semiconductor field effect transistor (n-channel MISFET) and a p-channel MISFET.

Figure 11:
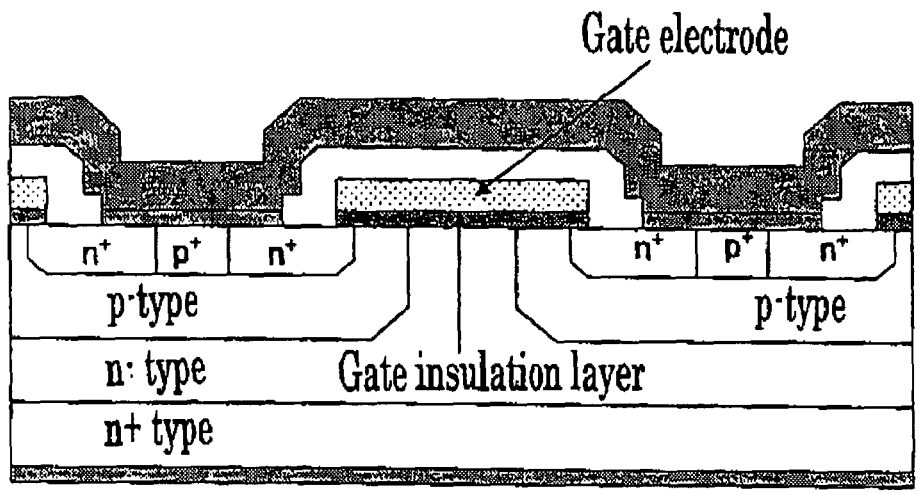
FIG. 11 is a cross-sectional view of a double metal-insulator-semiconductor (DMIS) circuit.

FIG. 11 is a cross-sectional view of a double metal insulator semiconductor (DMIS) circuit.

Figure 12:
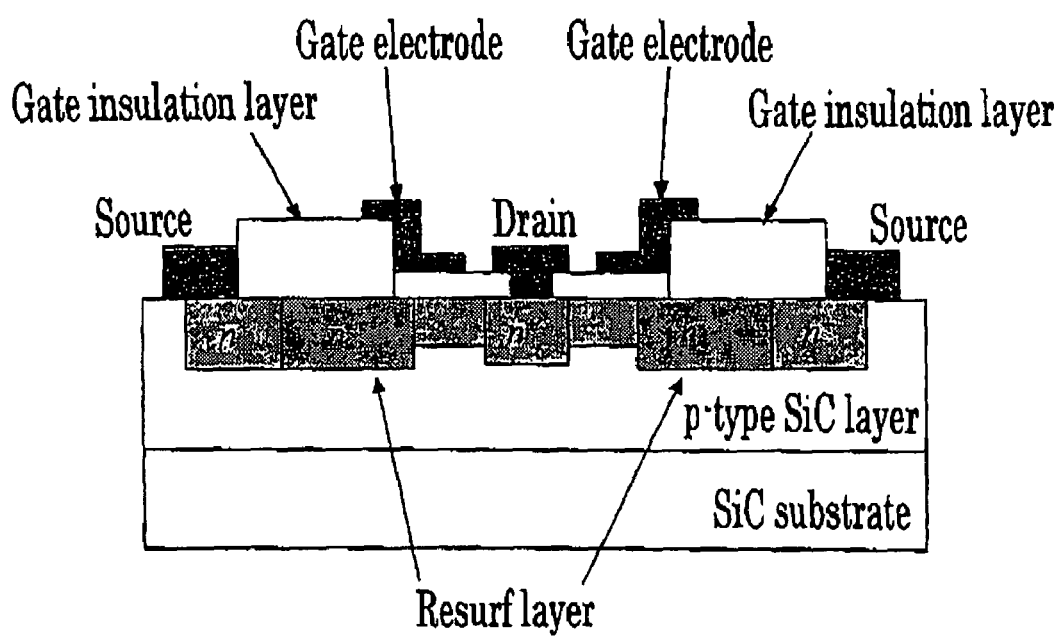
FIG. 12 is a cross-sectional view of a lateral resurf MISFET circuit.

FIG. 12 is a cross-sectional view of a lateral resurf MISFET circuit.

Figure 13:
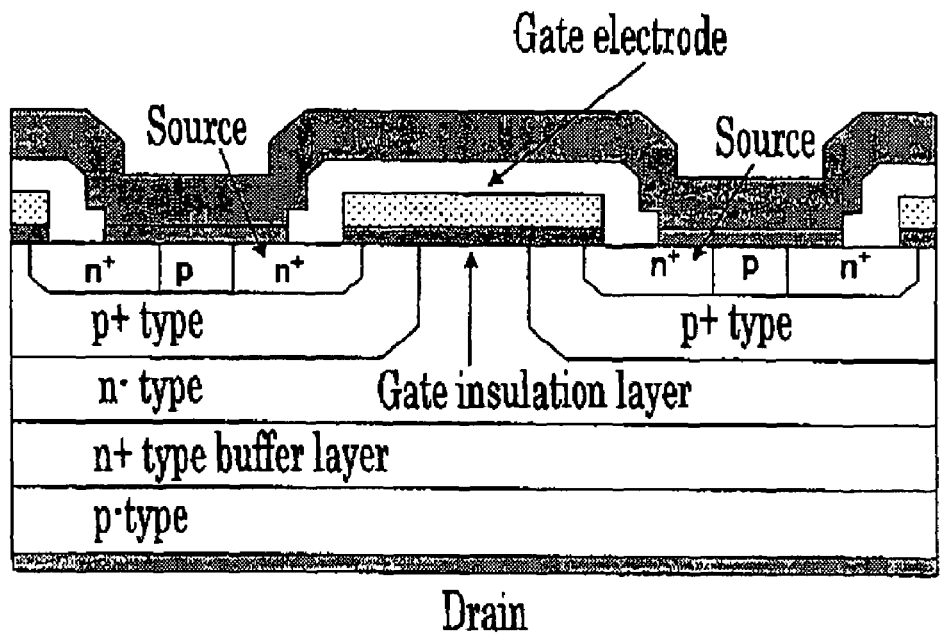
FIG. 13 is a cross-sectional view of an insulator gate bipolar transistor (IGBT) circuit. The n+ buffer layer may be omitted.

FIG. 13 is a cross-sectional view of an insulator gate bipolar transistor (IGBT) circuit, in which the n+ buffer layer may be omitted.

Figure 14:
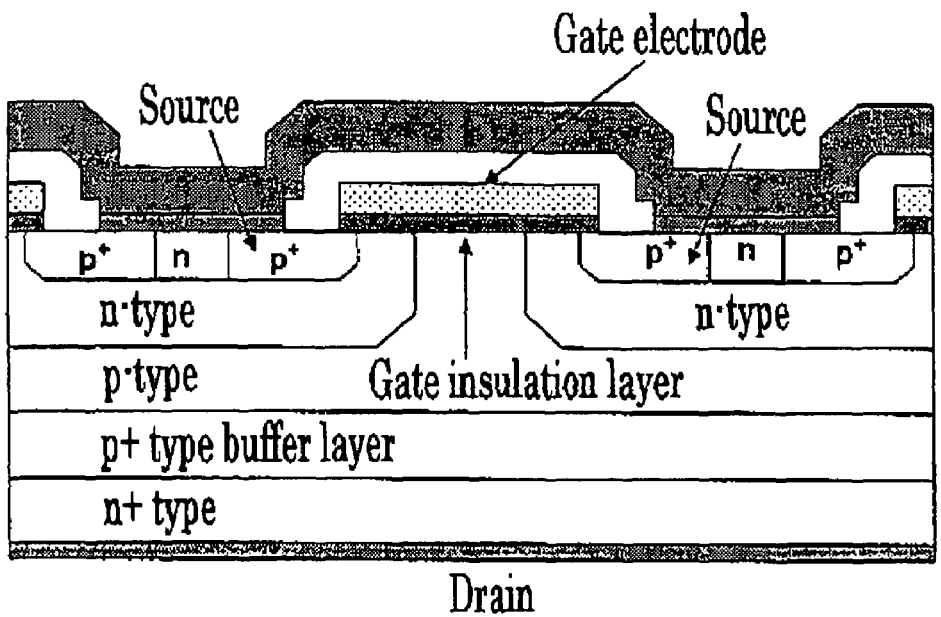
FIG. 14 is a cross-sectional view of a p-channel IGBT circuit. The p+ buffer layer may be omitted.

FIG. 14 is a cross-sectional view of a p-channel IGBT circuit, in which the p+ buffer layer may be omitted.

INDUSTRIAL APPLICABILITY

The Structure (SiC semiconductor device) according to the invention, configured as described in the foregoing, is suitable for application to semiconductor devices that use gate insulation layers, such as those of power devices having high voltage resistancehigh blocking voltage and high channel mobility, particularly to MOS capacitors, MOSFETs, CMIS circuits and DMIS circuits composed of n-channel MISFETs and p-channel MISFETs, and IGBT circuits.

The invention claimed is:

1. A method of manufacturing a semiconductor device comprising the steps of:
   forming a gate insulation layer on a semiconductor region formed of silicon carbide having a (000-1) face orientation;
   forming a gate electrode on the gate insulation layer;
   forming an electrode on the semiconductor region; and
   cleaning a surface of the semiconductor region
   wherein the gate insulation layer is formed in an atmosphere containing 1% or more H$_2$O (water) vapor at a temperature of from 800° C. to 1150° C. to reduce an interface trap density of an interface between the gate insulation layer and the semiconductor region.

2. A method according to claim 1, wherein the gate insulation layer is formed in an atmosphere containing $H_2O$ vapor at a temperature of from 800° C. to 1050° C.

3. A method of manufacturing a semiconductor device comprising the steps of:
forming a gate insulation layer on a semiconductor region formed of silicon carbide having a (000-1) face orientation;
forming a gate electrode on the gate insulation layer;
forming an electrode on the semiconductor region; and
cleaning a surface of the semiconductor region;
forming a gate insulation layer;
wherein the step of forming the gate insulation layer is followed by heat treatment in an atmosphere containing $H_2$ (hydrogen) gas or $H_2O$ (water) vapor to reduce an interface trap density of an interface between the gate insulation layer and the semiconductor region.

4. A method of manufacturing a semiconductor device comprising the steps of:
forming a gate insulation layer on a semiconductor region formed of silicon carbide having a (000-1) face orientation;
forming a gate electrode on the gate insulation layer;
forming an electrode on the semiconductor region; and
cleaning a surface of the semiconductor region;
wherein the step of forming the gate insulation layer is followed by heat treatment in an atmosphere containing $H_2O$ (water) vapor, followed by heat treatment in an atmosphere containing $H_2$ (hydrogen) gas to reduce an interface trap density of an interface between the gate insulation layer and the semiconductor region.

5. A method according to claim 3, wherein the heat treatment following the forming of the gate insulation layer is carried out in a mixed gas atmosphere of $H_2$ (hydrogen) gas and inert gas in which the $H_2$ (hydrogen) gas has a predetermined concentration of from 1% to 100%.

6. A method according to claim 3, wherein the heat treatment following the forming of the gate insulation layer is carried out in a mixed gas atmosphere of $H_2O$ (water) vapor and inert gas in which the $H_2O$ (water) vapor has a predetermined concentration of from 1% to 100%.

7. A method according to any one of claims 3, 5 and 6, further comprising a heat treatment step in which the semiconductor region is maintained for a predetermined time in an inert gas atmosphere at a predetermined temperature, between the step of forming a gate insulation layer and the step of heat treatment in an atmosphere containing $H_2$ (hydrogen) gas or $H_2O$ (water) vapor.

8. A method according to claim 4, further comprising a heat treatment step in which the semiconductor region is maintained for a predetermined time in an inert gas atmosphere at a predetermined temperature, in a first period between the step of forming a gate insulation layer and the step of heat treatment in an atmosphere containing $H_2O$ (water) vapor, or in a second period between a heat treatment step in an atmosphere containing $H_2O$ (water) vapor and a heat treatment step in an atmosphere containing $H_2$ (hydrogen) gas.

9. A method according to claim 4, wherein the heat treatment in an atmosphere containing $H_2O$ vapor takes place at a higher temperature than the heat treatment in an atmosphere containing $H_2$ gas.

10. A method according to claim 3, wherein the step of heat treatment in an atmosphere containing $H_2O$ (water) vapor, following the step of forming a gate insulation layer, is maintained for a predetermined time at a predetermined temperature of from 650° C. to 950° C.

11. A method according to claim 3, wherein the gate insulation layer is formed by thermal oxidation of the semiconductor region.

12. A method according to claim 11, wherein the thermal oxidation of the semiconductor region is carried out in an atmosphere containing $H_2O$ (water) vapor.

13. A method according to claim 12, wherein the atmosphere containing $H_2O$ vapor comprises $H_2O$ vapor and oxygen, or $H_2O$ vapor, oxygen and inert gas, in which the $H_2O$ gas has a predetermined concentration of from 1% to 100%.

14. A method according to claim 13, wherein when the heat treatment following the forming of the gate insulation layer is carried out in an atmosphere containing $H_2O$ vapor that comprises $H_2O$ vapor and oxygen gas, or $H_2O$ vapor, oxygen and inert gas, in which the $H_2O$ vapor has a predetermined concentration of from 10% to 50%.

15. A method according to claim 1, wherein the $H_2O$ (water) vapor is produced by a reaction between hydrogen ($H_2$) gas and oxygen ($O_2$) gas in the atmosphere in which the semiconductor region is placed.

16. A method according to claim 15, wherein a ratio $[O_2]/[H_2]$ between a flow rate $[H_2]$ of $H_2$ (hydrogen) gas and a flow rate $[O_2]$ of $O_2$ (oxygen) gas is within a predetermined range of from 0.1 to 100.

17. A method according to claim 3, wherein a semiconductor region oxidation temperature is within a predetermined range of from 800° C. to 1150° C.

18. A method according to claim 11, wherein when the heat treatment following the forming of the gate insulation layer by thermal oxidation of the semiconductor region is carried out in an atmosphere containing $H_2O$ vapor, the heat treatment is carried out at a temperature that is lower than a temperature at which the gate insulation layer is formed to increase a thickness of the gate oxide layer without increase of a thickness of the gate oxide layer.

19. A method according to claim 3, wherein the heat treatment in an atmosphere containing $H_2$ (hydrogen) gas is carried out at a temperature within a predetermined range of from 600° C. to 900° C.

20. A method according to claims 3, wherein formation of the gate insulation layer and the following heat treatment in an atmosphere of $H_2$ (hydrogen) gas, $H_2O$ (water) vapor or inert gas are carried out as a continuous process inside an apparatus shut off from outside air.

21. A method according to claim 1, wherein the step of cleaning the surface of the semiconductor region uses ultraviolet irradiation to clean the semiconductor region placed in an ozone atmosphere.

22. A method according to claims 1, wherein the step of cleaning the surface of the semiconductor region uses heat treatment in a $H_2$ (hydrogen) gas atmosphere.

23. A method according to claim 22, wherein the step of cleaning the surface of the semiconductor region includes a step of using ultraviolet irradiation to clean the semiconductor region placed in an ozone atmosphere, followed by a step of cleaning using heat treatment in a $H_2$ (hydrogen) gas atmosphere.

24. A method according to claim 1, further comprising the steps of forming an interlayer insulation layer, forming a wiring layer and forming an insulation layer that protects the wiring layer.

25. A method according to claim 3, wherein the heat treatment in an atmosphere containing $H_2$ gas is carried out after forming a gate electrode layer above the gate insulation layer.

26. A method according to claims 3, further comprising a step of heat treatment in an atmosphere containing $H_2$ (hydrogen) gas followed by a step of heat treatment in an inert gas atmosphere at up to 600° C.

27. A semiconductor device comprising a gate insulation layer on a semiconductor region of (000-1) face silicon carbide, a gate electrode on the gate insulation layer and an electrode on the semiconductor region, wherein a hydrogen or hydroxyl group (OH) level in the gate insulation layer is from $1E19/cm^3$ to $1E20/cm^3$.

28. A semiconductor device according to claim 27, wherein the semiconductor device is a metal-insulator-semiconductor (MIS) field effect transistor (FET) or a MIS capacitor.

29. A semiconductor device according to claim 28, wherein the MISFET is an n-channel type.

30. A semiconductor device according to claim 28, wherein the MISFET is a p-channel type.

31. A semiconductor device according to claim 27, wherein the semiconductor device is a circuit having a complementary metal-insulator-semiconductor (CMIS) composed of a MISFET or MIS capacitor.

32. A semiconductor device according to claim 27, wherein the semiconductor device is a lateral resurf metal-insulator-semiconductor field effect transistor (lateral resurf MISFET) or a lateral double MIS field effect transistor (lateral DMISFET).

33. A semiconductor device according to claim 27, wherein the semiconductor device is a vertical DMISFET.

34. A semiconductor device according to claim 27, wherein the semiconductor device is an insulated gate bipolar transistor (IGBT).

35. A semiconductor device according to claim 34, wherein the semiconductor device is a p-channel IGBT.

36. A semiconductor device comprising a gate insulation layer on a semiconductor region of (000-1) face silicon carbide, a gate electrode on the gate insulation layer and an electrode on the semiconductor region, wherein a hydrogen or hydroxyl group (OH) level at an interface between the gate insulation layer and the semiconductor region is within a range of from $1E20/cm^3$ to $1E22/cm^3$.

37. A semiconductor device according to claim 36, wherein the semiconductor device is a MISFET or a MIS capacitor.

38. A semiconductor device according to claim 37, wherein the MISFET is an n-channel MISFET.

39. A semiconductor device according to claim 37, wherein the MISFET is a p-channel MISFET.

40. A semiconductor device according to claim 36, wherein the semiconductor device is a circuit having a CMIS comprising a MISFET or MIS capacitor.

41. A semiconductor device according to claim 36, wherein the semiconductor device is a lateral resurf MISFET or lateral DMISFET.

42. A semiconductor device according to claim 36, wherein the semiconductor device is a vertical DMISFET.

43. A semiconductor device according to claim 36, wherein the semiconductor device is an IGBT.

44. A semiconductor device according to claim 43, wherein the semiconductor device is a p-channel IGBT.

* * * * *